United States Patent
Hsu

(10) Patent No.: US 11,843,401 B2
(45) Date of Patent: Dec. 12, 2023

(54) TRANSMITTER WITH SLEW RATE CONTROL

(71) Applicant: REALTEK SEMICONDUCTOR CORPORATION, Hsinchu (TW)

(72) Inventor: Chih-Hsun Hsu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 39 days.

(21) Appl. No.: 17/465,890

(22) Filed: Sep. 3, 2021

(65) Prior Publication Data
US 2022/0131561 A1  Apr. 28, 2022

(30) Foreign Application Priority Data
Oct. 28, 2020  (TW) .................................. 109137398

(51) Int. Cl.
*H04B 1/04* (2006.01)
*H03K 17/56* (2006.01)

(52) U.S. Cl.
CPC ............... *H04B 1/04* (2013.01); *H03K 17/56* (2013.01)

(58) Field of Classification Search
CPC ........ H02M 3/156; H02M 3/07; H02M 3/155; H02M 3/145; H02M 3/10; H02M 3/06; H02M 3/04; H02M 3/02
See application file for complete search history.

(56) References Cited

U.S. PATENT DOCUMENTS

| 8,219,343 B2* | 7/2012 | Lin ........................ H03K 5/133 702/179 |
| 9,461,539 B2* | 10/2016 | Chern .................... H02M 3/156 |
| 10,498,212 B2* | 12/2019 | Chang ................ H03K 17/6872 |

\* cited by examiner

*Primary Examiner* — Diana J. Cheng
(74) *Attorney, Agent, or Firm* — WPAT, P.C.

(57) ABSTRACT

A transmitter includes a pre-driver stage circuitry, a post-driver stage circuitry, and resistance adjustment circuits. The pre-driver stage circuitry is configured to output a second data signal according to a first data signal. The post-driver stage circuitry is configured to output a third data signal according to the second data signal. The resistance adjustment circuits are configured to provide a first variable resistor and a second variable resistor, and transmit a first power supply voltage and a second power supply voltage to at least one of the pre-driver stage circuitry or the post-driver stage circuitry, in order to adjust a slew rate of the third data signal.

15 Claims, 7 Drawing Sheets

TRANSMITTER WITH SLEW RATE CONTROL

BACKGROUND

1. Technical Field

The present disclosure relates to a transmitter. More particularly, the present disclosure relates to a transmitter with slew rate control.

2. Description of Related Art

In general, a slew rate of a data signal from a transmitter may be determined according to a receiving ability of a subsequent receiver and/or system requirement(s). In current approaches, a control mechanism of the slew rate requires a complex circuit, a voltage source, or a current source that is able to adjust an output ability. As a result, the complexity of circuits and/or related cost of the transmitter will be increased.

SUMMARY

In some aspects of the present disclosure, a transmitter includes a pre-driver stage circuitry, a post-driver stage circuitry, and resistance adjustment circuits. The pre-driver stage circuitry is configured to output a second data signal according to a first data signal. The post-driver stage circuitry is configured to output a third data signal according to the second data signal. The resistance adjustment circuits are configured to provide a first variable resistor and a second variable resistor, and transmit a first power supply voltage and a second power supply voltage to at least one of the pre-driver stage circuitry or the post-driver stage circuitry, in order to adjust a slew rate of the third data signal.

In some aspects of the present disclosure, a transmitter includes a first resistance adjustment circuit, a second resistance adjustment circuit, a first switch, a second switch, and a post-driver stage circuitry. The first resistance adjustment circuit is configured to provide a first variable resistor. The second resistance adjustment circuit is configured to provide a second variable resistor. A control terminal of the first switch is configured to receive a first data signal, a first terminal of the first switch is configured to receive a first power supply voltage via the first resistance adjustment circuit, and a second terminal of the first switch is configured to generate a second data signal. A control terminal of the second switch is configured to receive the second data signal, a first terminal of the second switch is coupled to the second terminal of the first switch, and a second terminal of the second switch is configured to receive a second power supply voltage via the second resistance adjustment circuit. The post-driver stage circuitry is configured to output a third data signal according to the second data signal. The first variable resistor and the second variable resistor are configured to adjust a slew rate of the third data signal.

These and other objectives of the present disclosure will be described in detailed description with various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
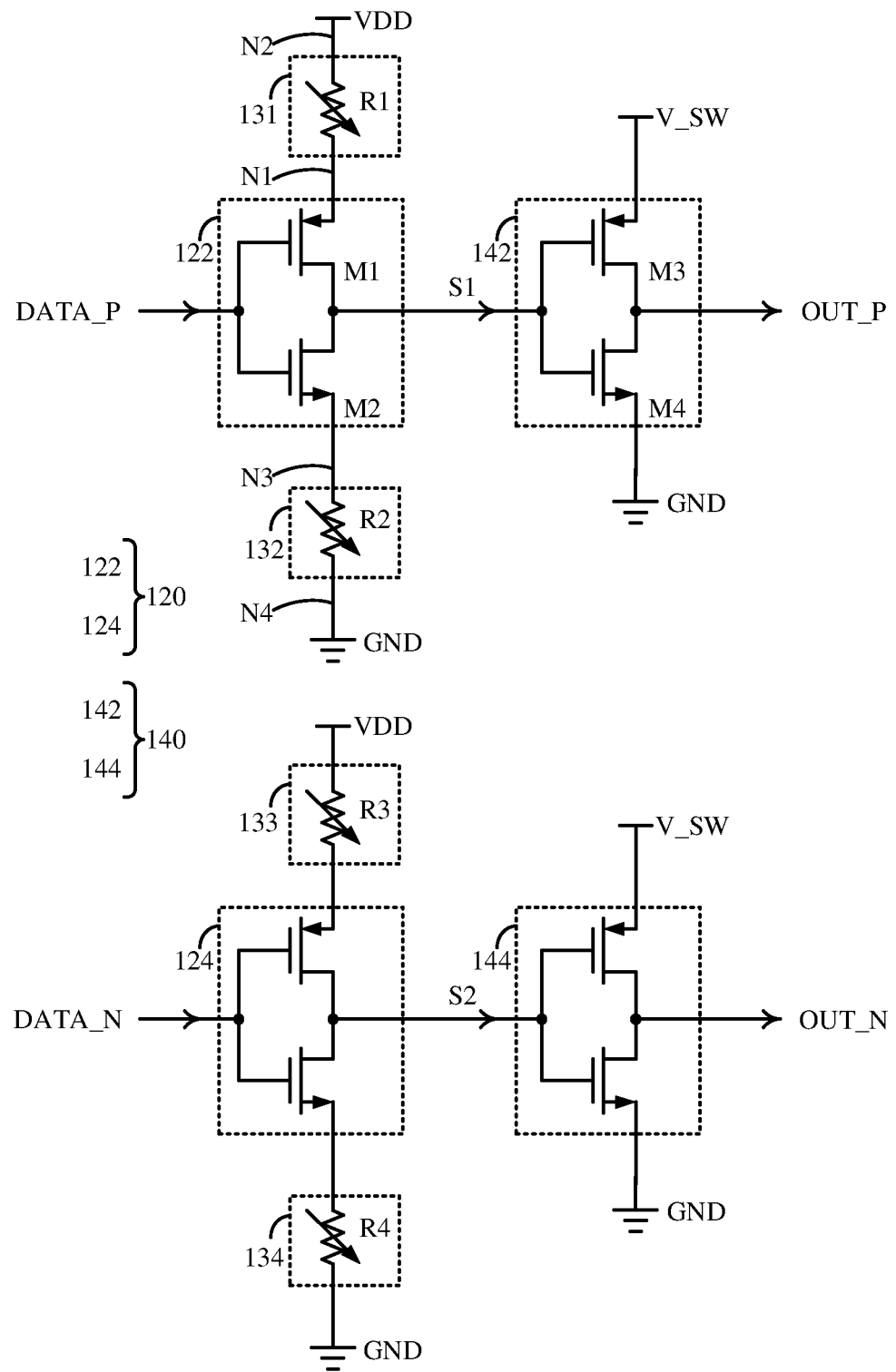
FIG. 1 is a schematic diagram of a transmitter according to some embodiments of the present disclosure.

FIG. 1 is a schematic diagram of a transmitter 100 according to some embodiments of the present disclosure. In some embodiments, the transmitter 100 may be applied to (but not limited to) a wired communication system.

The transmitter 100 includes a pre-driver stage circuitry 120, resistance adjustment circuits 131-134, and a post-driver stage circuitry 140. The pre-driver stage circuitry 120 generates a data signal S1 according to a data signal DATA_P, and generates a data signal S2 according to a data signal DATA_N. The post-driver stage circuitry 140 generates a data signal OUT_P according to the data signal S1 and generates a data signal OUT_N according to the data signal S2.

In greater detail, the pre-driver stage circuitry 120 includes an inverter circuit 122 and an inverter circuit 124. The post-driver stage circuitry 140 includes an inverter circuit 142 and an inverter circuit 144. The resistance adjustment circuit 131, the inverter circuit 122, the resistance adjustment circuit 132, and the inverter circuit 142 correspond to a channel, which is configured to process the data signal DATA_P to output the data signal OUT_P. The resistance adjustment circuit 133, the inverter circuit 124, the resistance adjustment circuit 134, and the inverter circuit 144 correspond to another channel, which is configured to process the data signal DATA_N to output the data signal OUT_N. In some embodiments, the data signal DATA_P and the data signal DATA_N may be differential signals.

The resistance adjustment circuit 131 is configured to transmit a power supply voltage VDD to the inverter circuit 122, and provide a variable resistor R1 to adjust a slew rate of the data signal OUT_P. The resistance adjustment circuit 132 is configured to transmit a power supply voltage GND (which may be, but not limited to, a ground voltage in this example) to the inverter circuit 122, and is configured to provide a variable resistor R2 to adjust a slew rate of the data signal OUT_P.

In some embodiments, the inverter circuit 122 includes a switch M1 (which may be implemented with a P-type transistor) and a switch M2 (which may be implemented with a N-type transistor). The inverter circuit 142 generates the data signal OUT_P according to the data signal S1. In some embodiments, the inverter circuit 142 includes a switch M3 (which may be implemented with a P-type transistor) and a switch M4 (which may be implemented with a N-type transistor). The resistance adjustment circuit 131 is coupled between a first terminal (labeled as a node N1) of the switch M1 and a node N2 for receiving the power supply voltage VDD. In other words, the first terminal of the switch M1 may receive the power supply voltage VDD via the resistance adjustment circuit 131. A second terminal of the switch M1 is configured to generate the data signal S1, and a control terminal of the switch M1 receives the data signal DATA_P. A first terminal of the switch M2 is coupled to the second terminal of the switch M1, and a control terminal of the switch M2 receives the data signal DATA_P. The resistance adjustment circuit 132 is coupled between the second terminal (labeled as a node N3) of the switch M2 and a node N4 for receiving the power supply voltage GND. In other words, the second terminal of the switch M2 may receive the power supply voltage GND via the resistance adjustment circuit 132.

A first terminal of the switch M3 receives a power supply voltage V_SW, a second terminal of the switch M3 is configured to generate the data signal OUT_P, and a control terminal of the switch M3 is coupled to the second terminal of the switch M1 to receive the data signal S1. A first terminal of the switch M4 is coupled to the second terminal of the switch M3, a second terminal of the switch M4 receives the power supply voltage GND, and a control terminal of the switch M4 is coupled to the second terminal of the switch M1 to receive the data signal S1. In some embodiments, the power supply voltage V_SW may be configured to set a voltage swing of the data signal OUT_P (and that of the data signal OUT_N outputted from the inverter circuit 144. If a level the power supply voltage V_SW is higher, the voltage swing of the data signal OUT_P (and that of the data signal OUT_N) is higher.

It is understood that, a rising time and a falling time of the data signal S1 are associated with at least one capacitor and at least one resistor (e.g., parasitic capacitor(s) and/or parasitic resistor(s) from transistor(s) and/or wire(s)) coupled to an output terminal of the inverter circuit 122. When the data signal S1 is transited from a low level to a high level, it indicates that the output terminal of the inverter circuit 122 is charged by a current (not shown in the figures) flowing through the variable resistor R1. Therefore, if the resistance adjustment circuit 131 transmits the power supply voltage VDD to the inverter circuit 122, the variable resistor R1 may be configured to adjust a charging time constant of the data signal S1. Alternatively, when the data signal S1 is transited from the high level to the low level, it indicates that the output terminal of the inverter circuit 122 is discharged by a current (not shown in the figures) flowing through the variable resistor R2. Therefore, if the resistance adjustment circuit 132 transmits the power supply voltage GND to the inverter circuit 122, the variable resistor R2 may be configured to adjust a discharging time constant of the data signal S1. As the data signal S1 and the data signal OUT_P having opposite phases (i.e., a phase difference therebetween is about 180 degrees), and thus the variable resistor R1 may be configured to adjust the falling time of the data signal OUT_P, and the variable resistor R2 may be configured to adjust the rising time of the data signal OUT_P. If a resistance value the variable resistor R1 is higher, a charging time constant of the data signal S1 is higher (i.e., the charging speed is slower), and the slew rate (e.g., a falling slew rate) of the data signal OUT_P is lower. If the variable resistor R2 is higher, a discharging time constant of the data signal S1 is higher (i.e., the discharging speed is slower), and the slew rate (e.g., a rising slew rate) of the data signal OUT_P is lower. Accordingly, by setting the resistance values of the variable resistor R1 and the variable resistor R2, the charging time constant and the discharging time constant of the data signal S1 may be adjusted, in order to adjust the slew rate of the data signal OUT_P to meet system requirements.

The resistance adjustment circuit 133 is configured to transmit the power supply voltage VDD to the inverter circuit 124, and is configured to provide a variable resistor R3 to adjust a slew rate of the data signal OUT_N. The resistance adjustment circuit 134 is configured to transmit the power supply voltage GND (which is a ground voltage in this example) to the inverter circuit 124, and is configured to provide a variable resistor R4 to adjust the slew rate of the data signal OUT_N. The inverter circuit 144 generates the data signal OUT_N according to the data signal S2 generated from the inverter circuit 124. The arrangements among the resistance adjustment circuit 133, the inverter circuit 124, the resistance adjustment circuit 134, and the inverter circuit 144 are similar to those among the resistance adjustment circuit 131, the inverter circuit 122, the resistance adjustment circuit 132, and the inverter circuit 142, and thus the repetitious descriptions are not further given. A resistance value of the variable resistor R3 may be configured to adjust a charging time constant of the data signal S2, in order to adjust a falling time and the slew rate (e.g., a falling slew rate) of the data signal OUT_N. A resistance value of the variable resistor R4 may be configured to adjust a discharging time constant of the data signal S2, in order to adjust a rising time and the slew rate (e.g., a rising slew rate) of the data signal OUT_N. Similarly, implementations of the resistance adjustment circuit 133, the inverter circuit 124, the resistance adjustment circuit 134, and the inverter circuit 144 may be understood with reference those of the resistance adjustment circuit 131, the inverter circuit 122, the resistance adjustment circuit 132, and the inverter circuit 142, and thus the repetitious descriptions are not further given.

Figure 2A:
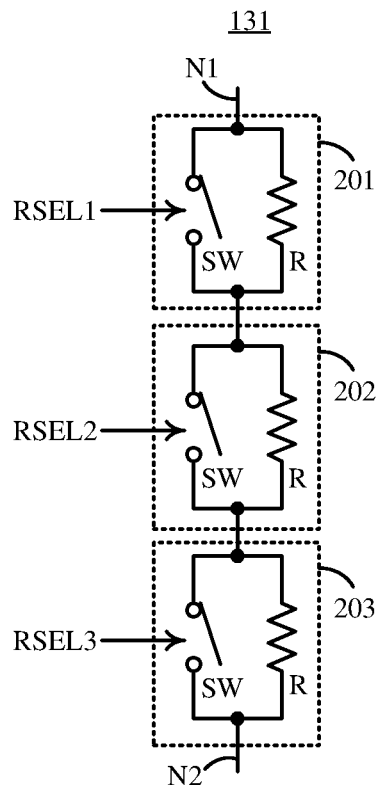
FIG. 2A is a schematic diagram of the resistance adjustment circuit in FIG. 1 according to some embodiments of the present disclosure.

FIG. 2A is a schematic diagram of the resistance adjustment circuit 131 in FIG. 1 according to some embodiments of the present disclosure. In some embodiments, the resistance adjustment circuit 131 includes switching circuits 201-203. In this example, the switching circuits 201-203 are coupled in series and between the node N1 and the node N2 in FIG. 1. The switching circuits 201-203 are selectively turned on according to control signals RSEL1-RSEL3 respectively, in order to provide the variable resistor RE In some embodiments, each of the switching circuits 201-203 includes a resistor R and a switch SW. The resistor R and the switch SW are coupled in parallel with each other, and the switch SW is selectively turned on according to a corresponding one of the control signals RSEL1-RSEL3. In this example, if a number of the switches SW being turned on is higher, the resistance value of the variable resistor R1 is lower. Alternatively, if the number of the switches SW being turned on is lower, the resistance value of the variable resistor R1 is higher. Therefore, with the control signals RSEL1-RSEL3, the resistance value of the variable resistor R1 may be adjusted, in order to control the slew rate of the data signal OUT_P.

Figure 2B:
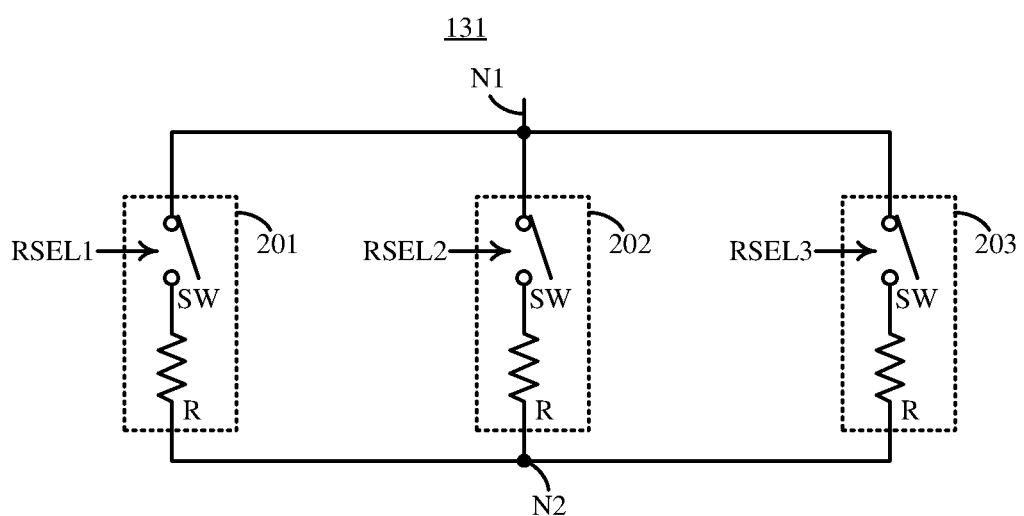
FIG. 2B is a schematic diagram of the resistance adjustment circuit according to some embodiments of the present disclosure.

FIG. 2B is a schematic diagram of the resistance adjustment circuit 131 according to some embodiments of the present disclosure. Compared with FIG. 2A, in this example, the switching circuits 201-203 are coupled between the node N1 and the node N2 in FIG. 2 and in parallel with each other, and the switch SW and the resistor R in each of the switching circuits 201-203 are coupled in series. In this example, if the number of switches SW being turned on is higher, the resistance value of the variable resistor R1 is lower. Alternatively, if the number of the switches SW being turned on is lower, the resistance value of the variable resistor R1 is higher.

It is understood that arrangements shown in FIG. 2A and FIG. 2B are given for illustrative purposes, and the present disclosure is not limited thereto. For example, the number of switching circuits may be adjusted correspondingly according to requirements of practical applications. Moreover, it is understood that, the arrangements shown in FIG. 2A and FIG. 2B may be employed to implement the resistance adjustment circuit 132, the resistance adjustment circuit 133, or the resistance adjustment circuit 134 in FIG. 1. For example, if the switching circuits 201-203 are employed to implement the resistance adjustment circuit 132 in FIG. 1, the node N1 and the node N2 shown in FIG. 1 may be respectively replaced with the node N3 and the node N4 in FIG. 1.

Figure 3:
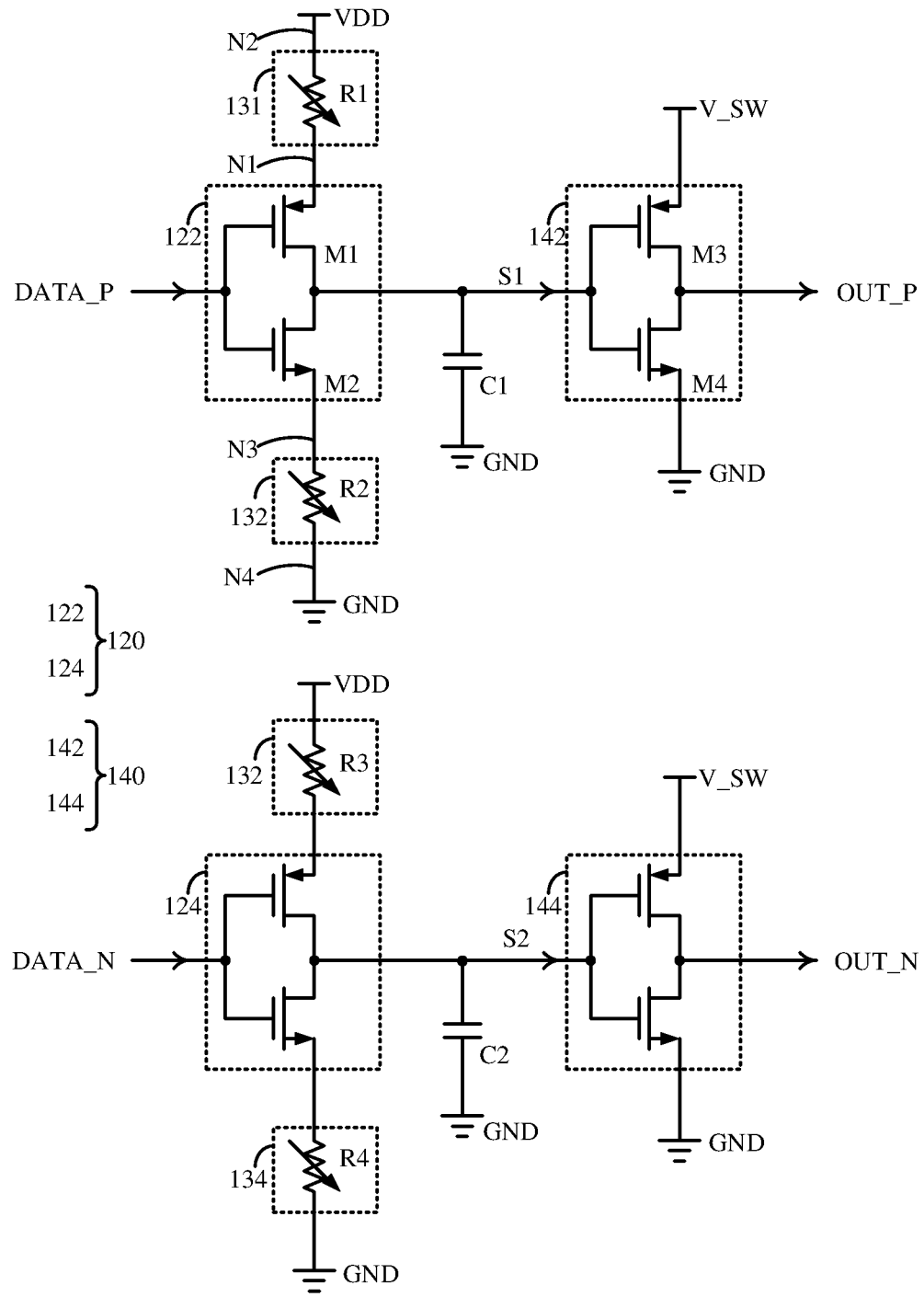
FIG. 3 is a schematic diagram of a transmitter according to some embodiments of the present disclosure.

FIG. 3 is a schematic diagram of a transmitter 300 according to some embodiments of the present disclosure. Compared with FIG. 1, in this example, the transmitter 300 further includes a capacitor C1 and a capacitor C2. The capacitor C1 is coupled between the pre-driver stage circuitry 120 and the post-driver stage circuitry 140, and is configured to cooperate with the resistance adjustment circuit 131 and the resistance adjustment circuit 132 to adjust the slew rate of the data signal OUT_P. In greater detail, the capacitor C1 is coupled to a second terminal (i.e., the output terminal of the inverter circuit 122) of the switch M1. In above examples of FIG. 1, the charging time constant of the data signal S1 is determined based on the variable resistor R1 and at least one parasitic capacitor (not shown in figures) coupled to the second terminal of the switch M1, and the discharging time constant of the data signal S1 is determined based on the variable resistor R2 and at least one parasitic capacitor (not shown in figures) coupled to the second terminal of the switch M1. Compared with the above examples, in FIG. 3, a capacitance value of capacitor(s) coupled to the second terminal of the switch M1 is determined mainly based on the capacitor C1. Therefore, the charging time constant of the data signal S1 may be determined based on both of the variable resistor R1 and the capacitor C1, and the discharging time constant of the data signal S1 may be determined based on both of the variable resistor R2 and the capacitor C1. If the capacitance value of the capacitor C1 is higher, the charging time constant and the discharging time constant of the data signal S1 are higher, and thus the slew rate of the data signal OUT_P is decreased.

Similar to the arrangements of the capacitor C1, the capacitor C2 is coupled between the inverter circuit 124 and the inverter circuit 144. The arrangements between the capacitor C2 and the inverter circuit 124 are similar to those between the capacitor C1 and the inverter circuit 122, and thus the repetitious descriptions are not further given. In some embodiments, each of the capacitor C1 and the capacitor C2 may be implemented with a capacitor having a fixed capacitance value. In some other embodiments, each of the capacitor C1 and the capacitor C2 may be implemented with a variable capacitor.

Figure 4:
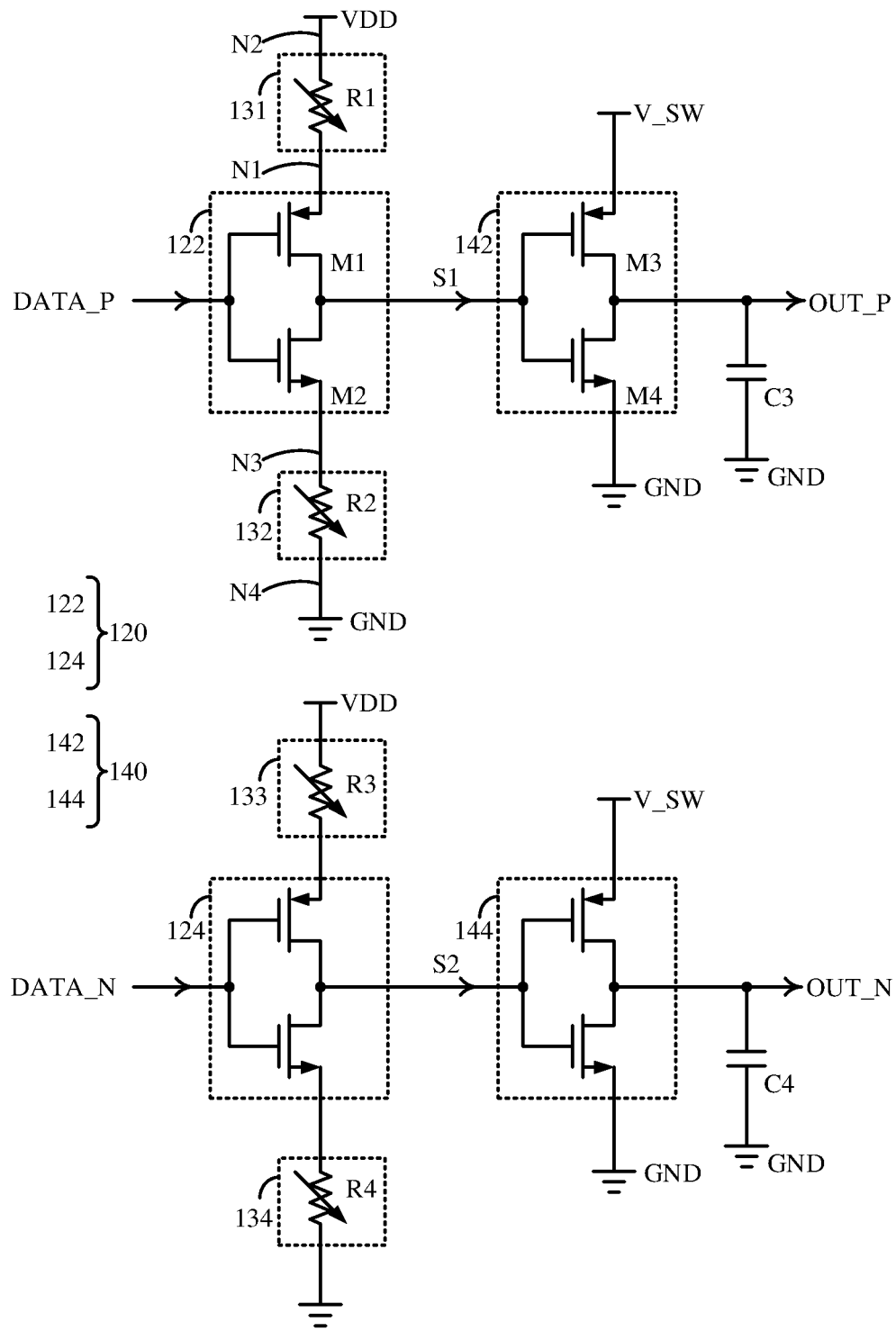
FIG. 4 is a schematic diagram of a transmitter according to some embodiments of the present disclosure.

FIG. 4 is a schematic diagram of a transmitter 400 according to some embodiments of the present disclosure. Compared with FIG. 1, in this example, the transmitter 400 further includes a capacitor C3 and a capacitor C4. The capacitor C3 and the capacitor C4 are coupled to output terminals of the post-driver stage circuitry 140 respectively. In greater detail, the capacitor C3 is coupled to an output terminal of the inverter circuit 142, and the capacitor C4 is coupled to an output terminal of the inverter circuit 144. The capacitor C3 may cooperate with the resistance adjustment circuit 131 and the resistance adjustment circuit 132 to adjust the slew rate of the data signal OUT_P. For example, when the capacitance value of the capacitor C3 is higher, the slew rate of the data signal OUT_P is lower. Similarly, the capacitor C4 may cooperate with the resistance adjustment circuit 133 and the resistance adjustment circuit 134 to adjust the slew rate of the data signal OUT_N.

In some embodiments, each of the capacitor C3 and the capacitor C4 may be implemented with a capacitor having a fixed capacitance value. In some other embodiments, each of the capacitor C3 and the capacitor C4 may be implemented with a variable capacitor. In some embodiments, because of an amplification effect of the post-driver stage circuitry 140, a capacitance value of the capacitor C3 (or the capacitor C4) is commonly set to be higher than that of the capacitor C1 (or the capacitor C2) in FIG. 3. The arrangements in FIG. 3 and FIG. 4 are given for illustrative purposes, and the present disclosure is not limited thereto. For example, in some other embodiments, a transmitter may include all capacitors C1-C4.

Figure 5:
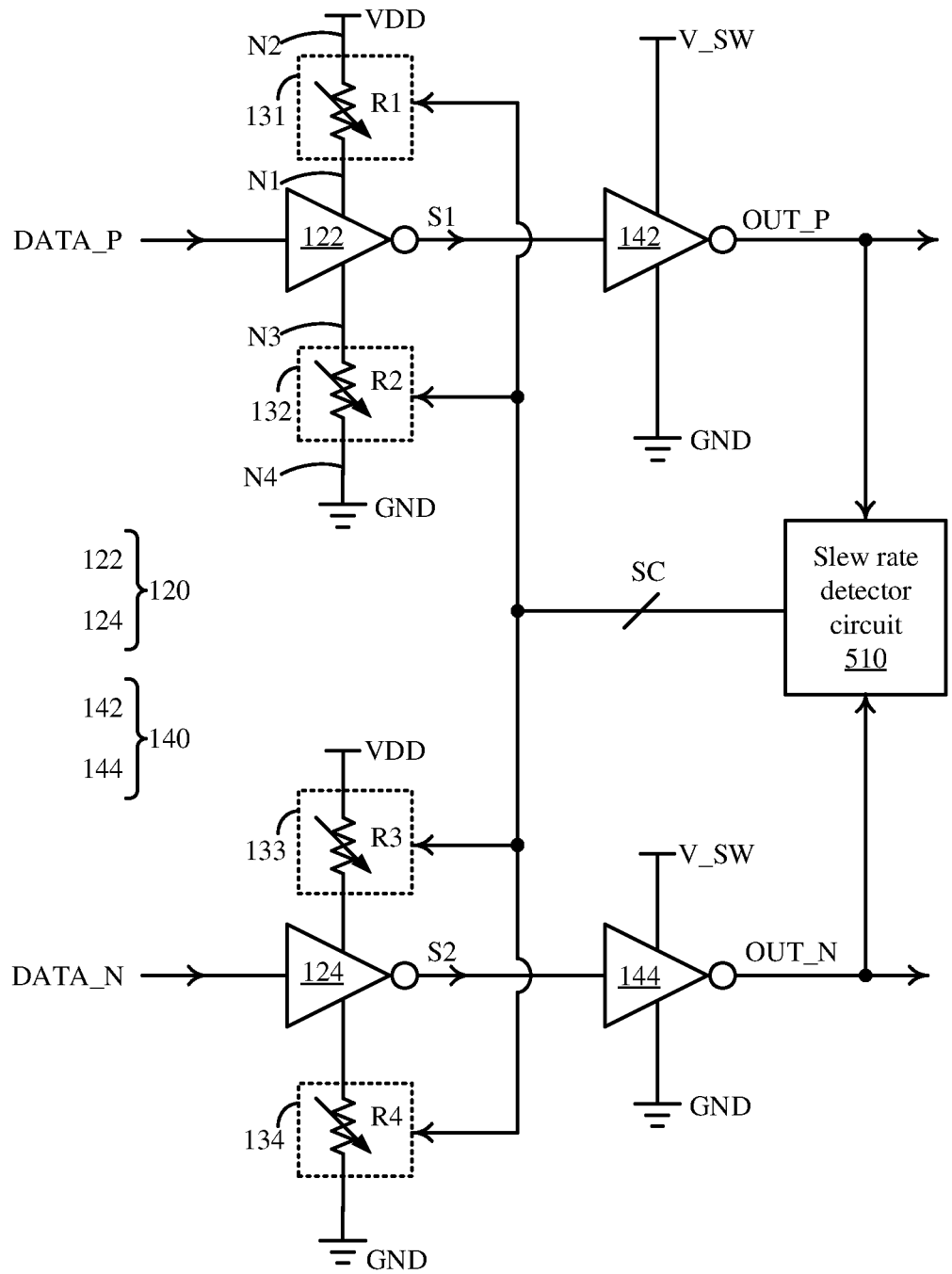
FIG. 5 is a schematic diagram of a transmitter according to some embodiments of the present disclosure.

FIG. 5 is a schematic diagram of a transmitter 500 according to some embodiments of the present disclosure. Compared with FIG. 1, in this example, the transmitter 500 further includes a slew rate detector circuit 510. The slew rate detector circuit 510 is configured to detect the slew rate of the data signal OUT_P and that of the data signal OUT_N, in order to generate control signals SC (which may be, for example, control signals RSEL1-RSEL3 in FIG. 2A or FIG. 2B). As a result, the resistance adjustment circuit 131, the resistance adjustment circuit 132, the resistance adjustment circuit 133, and the resistance adjustment circuit 134 may adjust the resistance values of the variable resistors R1-R4 according to these control signals.

In some embodiments, the slew rate detector circuit 510 may include high-pass filter circuits (not shown in the figures), a peak detector circuit (not shown in the figures), at least one comparator circuit (not shown in the figures), and a control logic circuit (not shown in the figures). These high-pass filter circuit generate first signals according to the data signal OUT_P and the data signal OUT_N. The peak detector circuit samples each first signal to generate second signals. The at least one comparator circuit compares a corresponding one of the first signals with a high reference voltage to generate a first detection signal and compares another corresponding one of the first signals with a low reference voltage, in order to generate a second detection signal. The control logic circuit may output these control signals according to the first detection signal and the second detection signal. In some embodiments, a level of the high reference voltage may be 0.8 times of the level of the power supply voltage V_SW, and a level of the low reference voltage may be approximately 0.2 times of the level of the power supply voltage V_SW. In some embodiments, a level of the high reference voltage may be approximately 0.9 times of the level of the power supply voltage V_SW, and a level of the low reference voltage may be approximately 0.1 times of the level of the power supply voltage V_SW.

The above implementations of the slew rate detector circuit 510 are given for illustrative purposes, and the present disclosure is not limited thereto. Various types of the slew rate detector circuit 510 are with the contemplated scope of the present disclosure.

Figure 6:
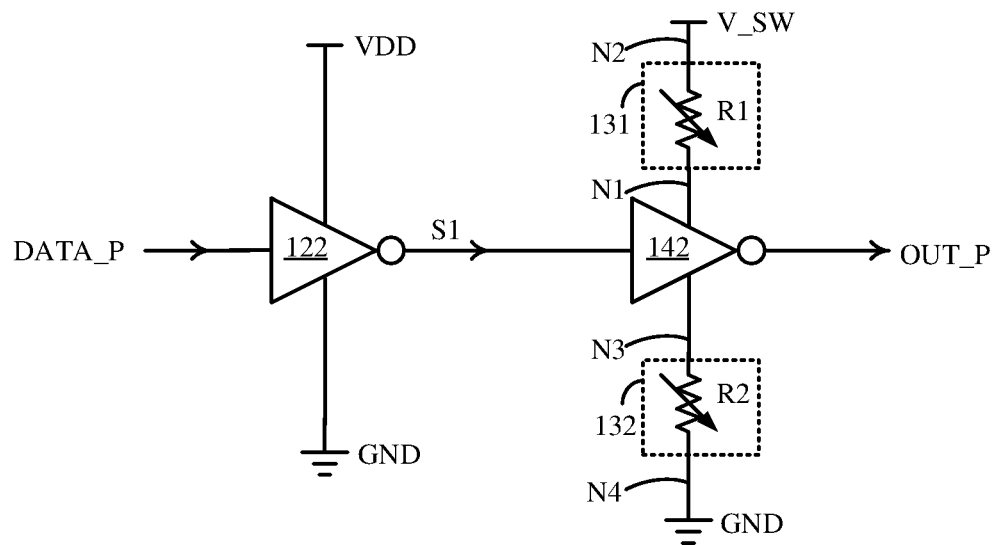
FIG. 6 is a schematic diagram of a transmitter according to some embodiments of the present disclosure.
Figure 6:
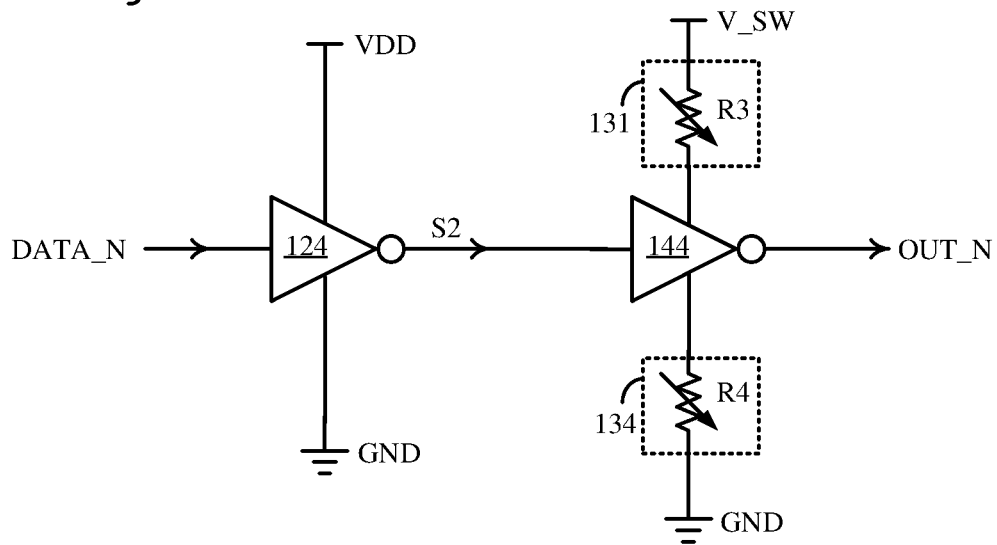

FIG. 6 is a schematic diagram of a transmitter 600 according to some embodiments of the present disclosure. In each above embodiment, the resistance adjustment circuits 131-134 are configured to adjust time constants of the data signal S1 and the data signal S2 outputted from the pre-driver stage circuitry 120, in order to adjust the slew rate of the data signal OUT_P and the data signal OUT_N. Compared with the above embodiments, in this example, the resistance adjustment circuits 131-134 are configured to transmit the power supply voltage V_SW and the power supply voltage GND to the post-driver stage circuitry 140, and to provide the variable resistors R1-R4, in order to directly adjust the slew rate of the data signal OUT_P and the data signal OUT_N.

If the resistance adjustment circuit 131 and the resistance adjustment circuit 132 transmit the power supply voltage V_SW and the power supply voltage GND to the inverter circuit 142, the variable resistor R1 may be configured to directly adjust the rising slew rate of the data signal OUT_P, and the variable resistor R2 may be configured to directly adjust the falling slew rate of the data signal OUT_P. For example, if the resistance value of the variable resistor R1 is higher, the charging time constant of the data signal OUT_P is higher, and thus the rising slew rate of the data signal OUT_P is lower. If the resistance value of the variable resistor R2 is higher, the discharging time constant of the data signal OUT_P is higher, and thus the falling slew rate of the data signal OUT_P is lower. Similarly, if the resistance value of the variable resistor R3 is higher, the charging time constant of the data signal OUT_N is higher, and thus the rising slew rate of the data signal OUT_N is lower. If the resistance value of the variable resistor R4 is higher, the discharging time constant of the data signal OUT_N is higher, and thus the falling slew rate of the data signal OUT_N is lower.

In addition, in this example, the pre-driver stage circuitry 120 does not receive the power supply voltage VDD and the power supply voltage GND via the resistance adjustment circuits 131-134. Arrangements among the resistance adjustment circuit 131, the inverter circuit 142, the resistance adjustment circuit 132 are similar to those among the resistance adjustment circuit 131, the inverter circuit 122, and the resistance adjustment circuit 132 in FIG. 1. Similarly, arrangements among the resistance adjustment circuit 133, the inverter circuit 144, and the resistance adjustment circuit 134 are similar to those among the resistance adjustment circuit 133, the inverter circuit 124, and the resistance adjustment circuit 134, and thus the repetitious descriptions are not given.

Figure 7:
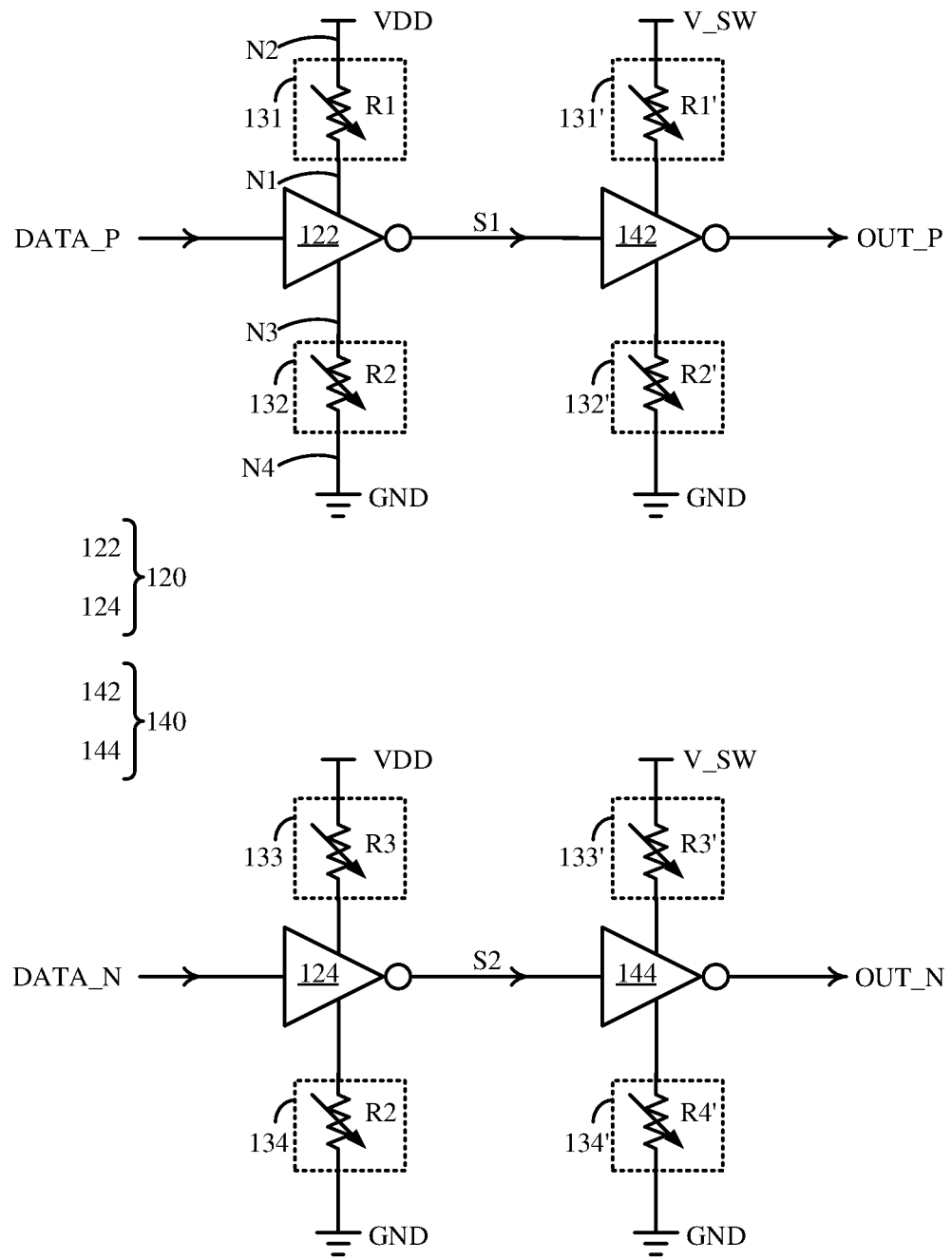
FIG. 7 is a schematic diagram of a transmitter according to some embodiments of the present disclosure.

FIG. 7 is a schematic diagram of a transmitter 700 according to some embodiments of the present disclosure. In this example, compared with the arrangements of the transmitter 100 in embodiments of FIG. 1, the transmitter 700 further includes resistance adjustment circuits 131'-134'. The resistance adjustment circuits 131'-134' are configured to transmit the power supply voltage V_SW and the power supply voltage GND to the post-driver stage circuitry 140, and are configured to provide variable resistors R1'-R4', in order to adjust the slew rate of the data signal OUT_P and the data signal OUT_N. If the resistance value of the variable resistor R1' is higher, the charging time constant of the data signal OUT_P is higher, and thus the rising slew rate of the data signal OUT_P is lower. If the resistance value of the variable resistor R2' is higher, the discharging time constant of the data signal OUT_P is higher, and thus the falling slew rate of the data signal OUT_P is lower. Similarly, if the resistance value of the variable resistor R3' is higher, the charging time constant of the data signal OUT_N is higher, and thus the rising slew rate of the data signal OUT_N is lower. If the resistance value of the variable resistor R4' is higher, and thus the discharging time constant of the data signal OUT_N is higher, and thus the falling slew rate of the data signal OUT_N.

Arrangements among the resistance adjustment circuit 131', the inverter circuit 142, and the resistance adjustment circuit 132' are similar to those among the resistance adjustment circuit 131, the inverter circuit 122, and the resistance adjustment circuit 132 in FIG. 1. Similarly, arrangements among the resistance adjustment circuit 133', the inverter circuit 144, and the resistance adjustment circuit 134' are similar to those among the resistance adjustment circuit 133, the inverter circuit 124, and the resistance adjustment circuit 134 in FIG. 1, and thus the repetitious descriptions are not further given.

According to the above embodiments, it is understood that, in different embodiments, the resistance adjustment circuits 131-134 (and/or the resistance adjustment circuits 131'-134') may provide the variable resistors R1-R4 (and/or the variable resistors R1'-R4'), and transmit the power supply voltages VDD and GND (or the power supply voltages V_SW and GND) to at least one of the pre-driver stage circuitry 120 or the post-driver stage circuitry 140.

Furthermore, it is understood that, the transmitter 600 (or the transmitter 700) may be applied to embodiments shown in FIG. 3, FIG. 4, and FIG. 5 as well. For example, the transmitter 600 (or the transmitter 700) may include the capacitor C1 and the capacitor C2, which are respectively coupled to the output terminals of the inverter circuit 122 and the inverter circuit 124. Alternatively, the transmitter 600 (or the transmitter 700) may include the capacitor C3 and the capacitor C4, which are respectively coupled to the output terminals of the inverter circuit 142 and the inverter circuit 144. The transmitter 600 (or the transmitter 700) may include the slew rate detector circuit 510, which is configured to detect the data signals the data signal OUT_P and OUT_N to generate control signals, in order to adjust the variable resistors R1-R4 (and/or the variable resistors R1'-R4').

In one or more aforementioned embodiments, certain transistors are N-type transistors, and certain transistors are P-type transistors. Each transistor may be implemented with a metal oxide semiconductor field effect transistor (MOSFET), but the present disclosure is not limited thereto. Various kinds or conductivity types of transistors able to perform similar operations are within the contemplated scope of the present disclosure. Furthermore, the above implementations of the pre-driver stage circuitry 120 and the post-driver stage circuitry 140 are given for illustrative purposes, and the present disclosure is not limited thereto. Various implementations of the pre-driver stage circuitry 120 the post-driver stage circuitry 140 able to be applied to a wire communication system are within the contemplated scope of the present disclosure.

As described above, the transmitter in some embodiments of the present disclosure is able to utilize variable resistor(s) to adjust charging/discharging time constant of the pre-driver stage circuitry, in order to adjust the slew rate of the output signal of the transmitter.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A transmitter, comprising:
a pre-driver stage circuitry configured to output a second data signal according to a first data signal and receive a first power supply voltage and a second power supply voltage;
a post-driver stage circuitry configured to output a third data signal according to the second data signal and set a voltage swing of the third data signal according to a third power supply voltage; and
a plurality of resistance adjustment circuits configured to provide a first variable resistor and a second variable resistor, and transmit the third power supply voltage and the second power supply voltage to the post-driver stage circuitry, in order to adjust a slew rate of the third data signal, wherein the first power supply voltage, the second power supply voltage, and the third power supply voltage are different voltages.

2. The transmitter of claim 1, wherein each of the plurality of resistance adjustment circuits comprises:

a plurality of switching circuits, coupled in series or in parallel with each other and coupled between the post-driver stage circuitry and a node, and configured to be selectively turned on according to a plurality of control signals, in order to provide the first variable resistor or the second variable resistor,
wherein the node is configured to receive the third power supply voltage or the second power supply voltage.

3. The transmitter of claim 2, wherein each of the plurality of switching circuits comprises:
a resistor; and
a switch coupled to the resistor and configured to be turned on according to one of the plurality of control signals.

4. The transmitter of claim 1, further comprising:
a capacitor coupled between the pre-driver stage circuitry and the post-driver stage circuitry and configured to cooperate with the plurality of resistance adjustment circuits to adjust the slew rate.

5. The transmitter of claim 1, further comprising:
a capacitor coupled to an output terminal of the post-driver stage circuitry and configured to cooperate with the plurality of resistance adjustment circuits to adjust the slew rate.

6. The transmitter of claim 1, wherein the first variable resistor is configured to adjust a rising slew rate of the third data signal, and the second variable resistor is configured to adjust a falling slew rate of the third data signal.

7. A transmitter, comprising:
a first resistance adjustment circuit configured to provide a first variable resistor;
a second resistance adjustment circuit configured to provide a second variable resistor;
a first switch, wherein a control terminal of the first switch is configured to receive a first data signal, a first terminal of the first switch is configured to receive a first power supply voltage via the first resistance adjustment circuit, and a second terminal of the first switch is configured to generate a second data signal;
a second switch, wherein a control terminal of the second switch is configured to receive the second data signal, a first terminal of the second switch is coupled to the second terminal of the first switch, and a second terminal of the second switch is configured to receive a second power supply voltage via the second resistance adjustment circuit; and
a post-driver stage circuitry configured to output a third data signal according to the second data signal and set a voltage swing of the third data signal according to a third power supply voltage,
wherein the first variable resistor and the second variable resistor are configured to adjust a slew rate of the third data signal, and the first power supply voltage, the second power supply voltage, and the third power supply voltage are different voltages.

8. The transmitter of claim 7, wherein the first resistance adjustment circuit further comprises:
a plurality of switching circuits coupled in series or in parallel with each other and between the first terminal of the first switch and a node, and configured to be selectively turned on according to a plurality of control signals, in order to provide the first variable resistor,
wherein the node is configured to receive the first power supply voltage.

9. The transmitter of claim 8, wherein each of plurality of switching circuits comprises:
a resistor; and a switch coupled to the resistor and configured to be selectively turned on according to one of the plurality of control signals.

10. The transmitter of claim 7, further comprising:
a capacitor coupled to the second terminal of the first switch and configured to cooperate with the first resistance adjustment circuit and the second resistance adjustment circuit to adjust the slew rate.

11. The transmitter of claim 7, further comprising:
a capacitor coupled to an output terminal of the post-driver stage circuitry and configured to cooperate with the first resistance adjustment circuit and the second resistance adjustment circuit to adjust the slew rate.

12. The transmitter of claim 7, further comprising:
a slew rate detector circuit configured to detect the slew rate of the third data signal, in order to generate a plurality of control signals,
wherein the first resistance adjustment circuit and the second resistance adjustment circuit are further configured to adjust the first variable resistor and the second variable resistor according to the plurality of control signals.

13. The transmitter of claim 7, wherein the first variable resistor is configured to adjust a charging time constant of the second data signal.

14. The transmitter of claim 7 wherein the second variable resistor is configured to adjust a discharging time constant of the second data signal.

15. The transmitter of claim 7, wherein the first switch and the second switch operate as an inverter circuit in a pre-driver stage circuitry.

* * * * *